United States Patent
Kniazev et al.

(10) Patent No.: US 9,691,861 B2
(45) Date of Patent: Jun. 27, 2017

(54) METHOD FOR ANALYZING DISCRETE TRAPS IN SEMICONDUCTOR DEVICES

(71) Applicant: Mitsubishi Electric Research Laboratories, Inc., Cambridge, MA (US)

(72) Inventors: Andrei Kniazev, Cambridge, MA (US); Qun Gao, Gainesville, FL (US); Koon Hoo Teo, Lexington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 68 days.

(21) Appl. No.: 14/149,345

(22) Filed: Jan. 7, 2014

(65) Prior Publication Data
US 2015/0192635 A1    Jul. 9, 2015

(51) Int. Cl.
| | | |
|---|---|---|
| H01L 29/20 | (2006.01) | |
| H01L 21/66 | (2006.01) | |
| H01L 29/778 | (2006.01) | |
| G01R 31/26 | (2014.01) | |
| G01R 31/28 | (2006.01) | |

(52) U.S. Cl.
CPC ...... *H01L 29/2003* (2013.01); *G01R 31/2642* (2013.01); *G01R 31/2894* (2013.01); *H01L 22/14* (2013.01); *H01L 29/778* (2013.01)

(58) Field of Classification Search
CPC ............ G01R 31/2642; G01R 31/2648; H01L 29/66196; H01L 22/14; H01L 29/2003; H01L 29/7787
USPC .................................................. 324/760.01
See application file for complete search history.

(56) References Cited

U.S. PATENT DOCUMENTS

| | | | | |
|---|---|---|---|---|
| 9,329,223 | B2 * | 5/2016 | Montenegro | G01R 31/2648 |
| 2005/0047601 | A1 * | 3/2005 | Shields | H04B 10/70 |
| | | | | 380/283 |
| 2006/0126992 | A1 * | 6/2006 | Hashimoto | G02B 6/12009 |
| | | | | 385/14 |
| 2007/0132523 | A1 * | 6/2007 | Newman | G01R 31/2856 |
| | | | | 331/175 |
| 2010/0098143 | A1 * | 4/2010 | Kitagaki | H04N 5/357 |
| | | | | 375/224 |
| 2010/0100337 | A1 * | 4/2010 | Vichare | G06F 11/008 |
| | | | | 702/34 |
| 2013/0214810 | A1 * | 8/2013 | Huang et al. | 324/762.01 |
| 2013/0329577 | A1 * | 12/2013 | Suzuki | H04L 12/54 |
| | | | | 370/252 |

OTHER PUBLICATIONS

Jungwoo Joh and J.A. del Alamo. A current-transient methodology for trap analysis for GaN high electron mobility transistors. Electron Devices, IEEE Transactions on, 58(1):132-140, 2011.

(Continued)

*Primary Examiner* — Son Le
*Assistant Examiner* — Akm Zakaria
(74) *Attorney, Agent, or Firm* — Gene Vinokur; James McAleenan; Hironori Tsukamoto

(57) ABSTRACT

A method analyzes traps in a semiconductor device by determining a first-order derivative of a signal representing an operation of the semiconductor device over time to produce a signal rate change. The traps in the semiconductor device are analyzed based on lifetimes corresponding to peaks of the signal rate change.

31 Claims, 13 Drawing Sheets

(56) References Cited

OTHER PUBLICATIONS

Donghyun Jin and J.A. del Alamo. Mechanisms responsible for dynamic on-resistance in GaN high-voltage HEMTs. In Power Semiconductor Devices and ICs (ISPSD), 2012 24th International Symposium on, pp. 333-336, 2012.
James W. Cooley and John W. Tukey. An algorithm for the machine calculation of complex Fourier series. Mathematics of Computation, 19(90):pp. 297-301, 1965.

* cited by examiner

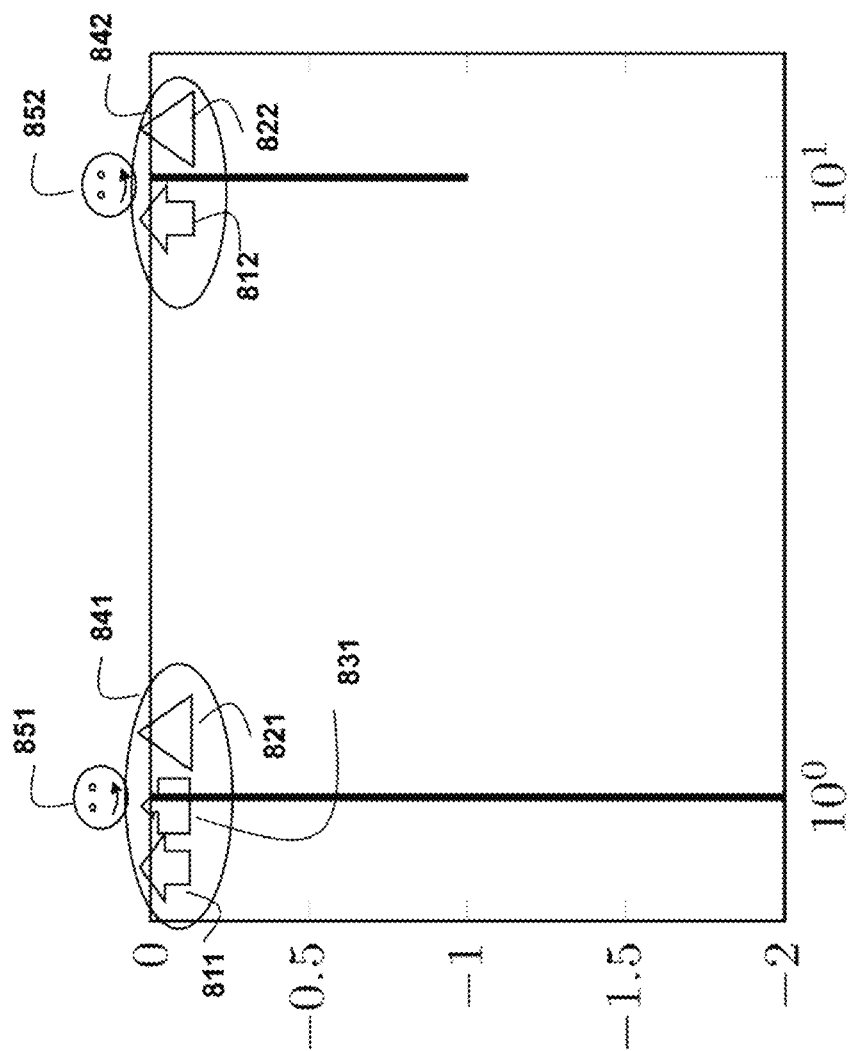

METHOD FOR ANALYZING DISCRETE TRAPS IN SEMICONDUCTOR DEVICES

FIELD OF THE INVENTION

This invention relates generally to semiconductor devices, and more particularly to analyzing traps in the semiconductor devices.

BACKGROUND OF THE INVENTION

In semiconductor devices, traps pertain to impurities or dislocations that capture carriers, and keep the carriers strongly localized. The traps play an important role in the performance and reliability of semiconductor devices. An understanding of the behaviors of the traps can improve the design, manufacture, performance and reliability of the semiconductor devices.

For example, gallium nitride (GaN) and aluminum gallium nitride (AlGaN) high-electron-mobility transistors (HEMTs) are often used in high frequency power amplifiers, high speed switches, and radar and satellite applications because of the excellent material properties of III-nitrides, such as high breakdown field, high electron mobility, high power density, and high electron saturation velocity. One requirement for high-power applications is to achieve a low resistance during and after switching ON. The dynamic ON resistance can dramatically increase with biasing conditions. These changes in ON resistance are known to be caused by a trapping effect. The exact failure mechanism of the degradation of the HEMTs is still an active area of research. Reasons for the degradation have been attributed to "hot" carriers, inverse piezoelectric effects, and lattice mismatches, for example.

Effects of the traps on the performance of the semiconductor device are temporal and eventually decay over time, i.e., the behavior of the measured quantity of the operation of the semiconductor device stabilizes and approaches a constant. Each trap is assumed to behave exponentially in time with a specific lifetime. Collectively, multiple traps influence the operation of the device. Therefore, methods that can compute and display information of the lifetimes of the trapping and detrapping processes allow detecting and analyzing the traps.

Since recovery from traps can take nano-seconds, minutes, or even days, the analysis of this effect is extremely important because traps severely degrade the performance and reliability of semiconductor devices. Trap analysis is also important for characterizing the formation and behavior of traps so that the devices can be modeled, designed, and manufactured with improved performance and reliability. The lifetimes can be related to the temperatures and activation energies of the traps. The captured or released coefficient could be a function of the initial number of traps to be filled or number of carriers in the traps to be released, respectively.

The information of the lifetimes of the traps, as a function of temperature, allows one to calculate the activation energy and cross-sectional density of the traps, which are very important parameters to understand the behavior of traps. Current GaN device electrical models do not capture the characteristics of traps. Accurate extraction of trap lifetimes of a device would provide information that leads to development of more accurate electrical models of the device. System design using the device with a more accurate device model, such as the design of a RF power amplifier, would greatly help to achieve optimal performance, such as power efficiency and distortion reduction.

Conventional methods for analyzing trap behavior in GaN HEMTs include a method described by Jungwoo et al., "A Current-Transient Methodology for Trap Analysis for GaN High Electron Mobility Transistors," IEEE Transactions on, 58(1):132-140, 2011, and a method described by Donghyun et al., "Mechanisms responsible for dynamic ON-resistance in GaN high-voltage HEMTs," Power Semiconductor Devices and ICs (ISPSD), 2012 24th International Symposium on, pages 333-336, 2012. Those conventional methods are inaccurate and computationally complex.

The above conventional methods are based on the least square fitting using basis functions, which are non-orthogonal to each other, with a uniform, in the logarithmic time scale, placement of the time constants describing trap lifetimes, essentially assuming a continuous distribution of trap lifetimes. A good fitting requires the number of the basis functions to be large enough, in which case the basis functions in the prior art are not just non-orthogonal, but also nearly linearly dependent. A numerically valid basis is not formed in those conventional methods, leading to an extremely poorly conditioned least squares problem and thus resulting in erroneous lifetime computations. Conventional approaches apply constraints, such as lower and upper bounds or smoothness in the spectrum, in the least square fitting, to decrease the ill-conditioning, but this dramatically increases the computational time, while still not resolving satisfactory the inaccuracy in the lifetime calculations.

Accordingly, there is a need to provide an efficient and accurate method for analyzing traps in the semiconductor devices.

SUMMARY OF THE INVENTION

The embodiments of the invention provide a method for analyzing traps in semiconductor devices, for example, GaN or AlGaN HEMTs. The analysis characterizes the behavior of traps so as to model, design, and manufacture semiconductor devices with improved performance and reliability.

In the absence of any traps, the semiconductor system behavior in time would be constant, i.e., $I = I_\infty$. A single trap is assumed to add one purely exponential component, i.e., $I = ce^{-t/\tau} + I_{2S}$, characterized by the trap lifetime $\tau$, where the magnitude $c$ represents the initial condition of the trapping or detrapping process, related to the initial trap population with carriers in this process. The semiconductor system with multiple traps, trapping and releasing mobile charge carriers, is assumed to follow a multiexponential behavior in time. By "multiexponential," we mean that the behavior in time is described by a linear combination of a finite number of purely exponential in time functions, with different lifetimes, i.e., $$I = \sum_i c_i e^{-t/\tau_i} + I_\infty.$$

Having the transient data $I_{data}(t)$ measured as a function of t, at several times t, the goal of the method is to automatically determine the constant $I_\infty$, the total number of the purely exponential components present, and the numerical values of the lifetime $\tau_i$ and the corresponding magnitude $c_i$ for each of the exponential components.

The embodiments are based on a realization that dominant lifetimes $\tau_i$ of the traps may be discrete, i.e., sparsely distributed, in which case nearby locations of the dominant trap lifetimes $\tau_i$ in the time-constant spectrum can be identified by finding the locations of the maxima of the absolute value of the first derivative of the signal data function $I_{data}(t)$. The sparsity of the distribution is determined using a threshold.

Input data are acquired from experimental measurements done on the semiconductor device. The method may interpolate the data to a dense uniform logarithmic grid in a time domain with a grid size of $2^k$ so that a conventional discrete fast Fourier transform (FFT) in the filtering in the next step can be used. The interpolated data may be filtered to reduce noise by a cosine Fourier transform or conventional smoothing.

The first-order derivative of the (filtered) signal data can be determined by transforming the data to a frequency domain to obtain the derivative using a Fourier spectral method and then performing an inverse FFT to determine the derivative in the time domain. Alternatively, numerical methods using a finite difference method can be applied.

The nearby locations of the dominant trap lifetimes $\tau_i$ in the time-constant spectrum are identified by finding the locations of the maxima of the absolute value of the derivative. Each maximum in the absolute value corresponds to a pure exponential component with the lifetime constant near that location to produce a good initial approximation for the trap lifetimes, i.e., their total number and values. A least squares method may then be used to determine the values of the magnitudes $c_i$ (captured or released coefficients) corresponding to each trap lifetime. Using all of the above lifetimes and magnitudes as the initial approximations, a nonlinear least squares method may be used to optimize both $c_i$ and $\tau_i$ simultaneously.

In general, lifetime information of a semiconductor device enables one to know the kinds of traps that are dominant in the device and especially those traps that could impact performance and/or reliability. Therefore, in a manufacturing environment, instruments that can capture and display instantaneous in formation of the lifetimes of the traps in the device would allow real-time quality control of the devices that are rolling out in a manufacturing line.

BRIEF DESCRIPTION OF THE DRAWINGS

FIG. 8B is a schematic of peak identification that identifies group of lifetimes for a matrix version of the method of FIG. 8A;

DETAILED DESCRIPTION OF THE PREFERRED EMBODIMENT

Figure 1:
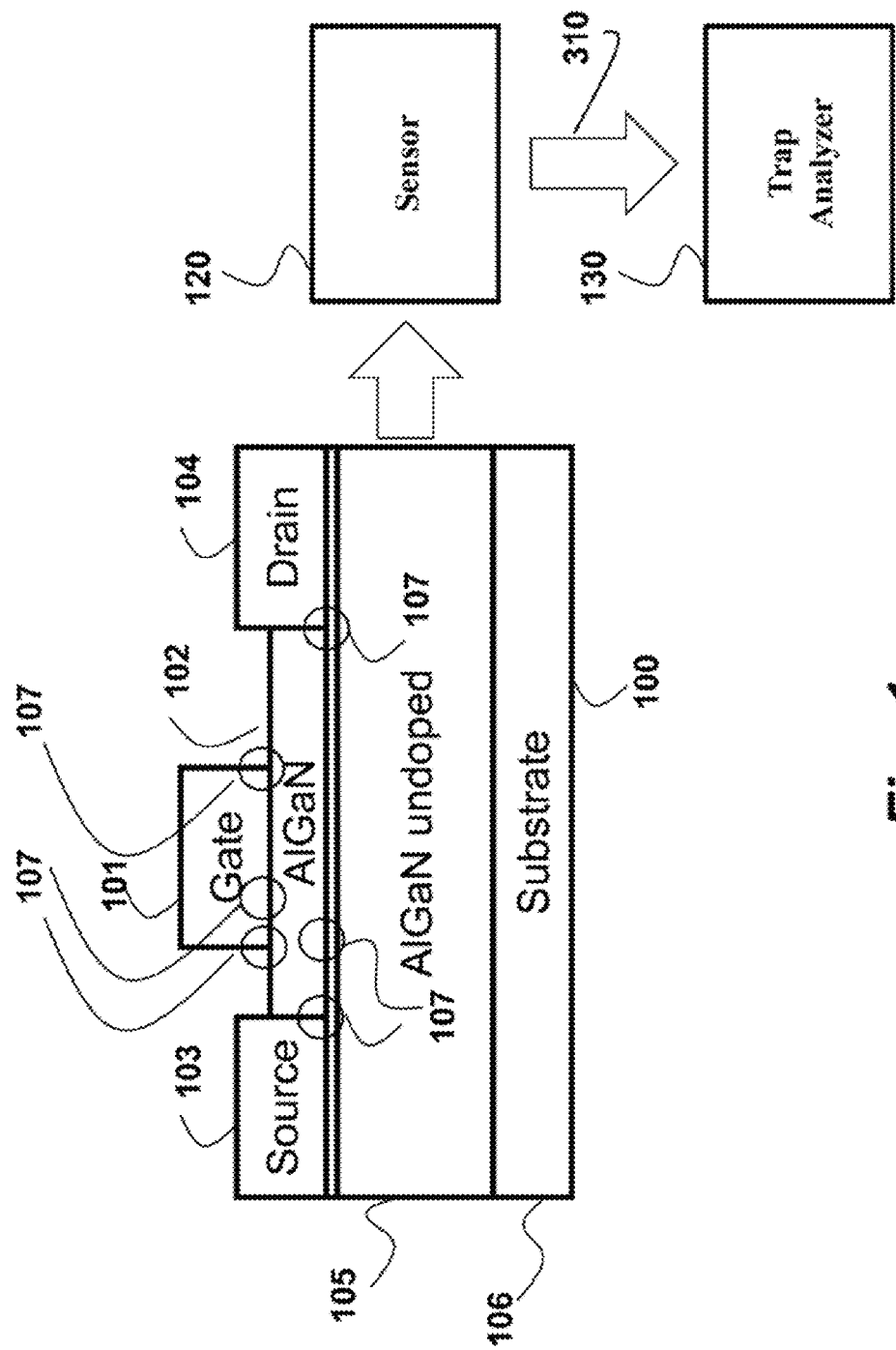
FIG. 1 is a block diagram of an example semiconductor device analyzed by embodiments of the invention.

FIG. 1 shows a simplified structure of an example semiconductor device 100, such as gallium nitride (GaN) and aluminum gallium nitride (AlGaN) high-electron-mobility transistors (HEMTs). The device includes a source 101 deposited on an AlGaN layer 102, which is flanked by a source 103 and a drain 104. The transistor also includes an AlGaN undoped layer 105, and a substrate 106. The areas 107 show some possible physical locations of the traps in the device.

A sensor 120 can acquire a data signal 310 characterizing an operation of the semiconductor device over time. Typically, the signal is converted to digital data before processing. However, it is understood that the processing can also occur in the analog domain. Due to the traps with different lifetimes, the data exhibit multi-exponential behavior that stabilizes after a period of time. Various embodiments of the invention apply a trap analyzer 130 to the data. The analysis is based on the multi-exponential behavior of the measured data signal. For example, the traps analyzer 130 can determine existence of a single trap or multiple traps, and compute discrete lifetimes of the traps and a corresponding magnitude for each discrete lifetime. The sensor 120 and the analyzer 130 can be incorporated in the semiconductor device, or connected externally to the device.

A function $ce^{-t/\tau}$ represents an exponential process over time t, where a parameter $\tau$ is a lifetime of the decay, which is inversely proportional to the decay rate, because $$\frac{d(ce^{-t/\tau})}{dt} = -\frac{1}{\tau}ce^{-t/\tau}.$$

The coefficient c expresses a magnitude of the exponential processes. The magnitude c for a fixed lifetime $\tau$ represents the initial contribution of the corresponding function $ce^{-t/\tau}$ to the measured data at the time t=0. For semiconductor traps, the magnitude c is the captured or released coefficient, which may be related to a total initial number of traps or charges participating in the trap process for the fixed lifetime $\tau$, described by the signal function $ce^{-t/\tau}$. Positive and negative values of c correspond to trapping and detrapping, respectively.

Because of the assumption that the signal represents multi-exponential behavior, some embodiments use the fitting function $$I = \sum_i c_i e^{-t/\tau_i} + I_\infty,$$

where the exponential component $e^{-t/\tau_i}$ is treated as a basis function for the fitting function and $c_i$ is the coefficient or magnitude for each basis function. The basis function represents the behavior of an exponential process characterized by the trap lifetime $\tau_i$, and the magnitude $c_i$ represents the initial trap population in this process.

The trap analyzer 130 analyzes the traps by fitting a function I to the signal 310. Some embodiments of the invention are based on a recognition that the fitting function I is a multi-exponential function formed by a linear combination of the exponential curves. There can be several typical types of dominant traps and each trap can have a distinct lifetime. The overall behavior of the semiconductor device involves several independent trapping and detrapping processes, each exponential in time.

Since the number and the distribution of the trap lifetimes are unknown, the analysis is difficult. However, some embodiments are based on a realization that the lifetime of the exponentially decaying signal corresponds to a fastest rate of change of the signal. A rate of change (i.e. a rate of a change of the signal over time) can be determined by a first-order derivative of the signal. Thus, the peaks of the absolute value of the derivative of the basis function indicate the initial estimates of the lifetimes $\tau_i$. This approach is advantageous when there is a relatively large spacing between dominant lifetimes, i.e., $\min(|\tau_i-\tau_j|)$ is large, as determined by a threshold, relative to the complete time interval, in a time logarithmic scale. In this case, we call lifetimes discrete, i.e., sparsely distributed.

Figure 2A:
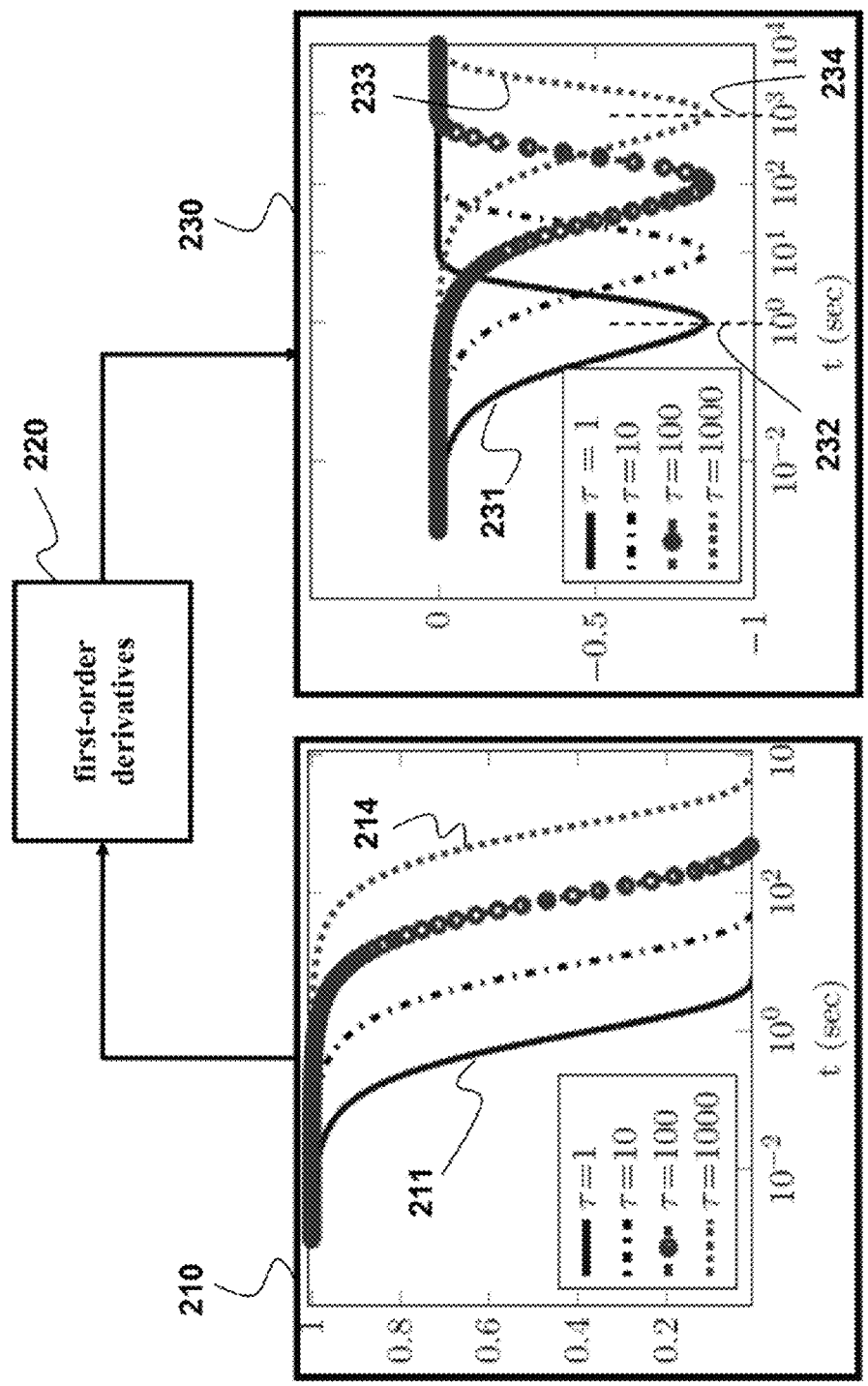
FIGS. 2A and 2B are schematics of trap analysis using first-order derivatives according to embodiments of the invention.

FIG. 2A shows illustrates the principles of the embodiments. The plot 210 shows examples of the exponentially decaying signals, e.g., the signals 211 and 214 with different lifetimes. The first-order derivative 220 of the exponentially decaying signals produces signal rate changes 230 having peaks at the locations corresponding to the lifetimes of the corresponding exponentially decaying signals.

For example, the signal rate change 231 has a peak, i.e., a maximum absolute value, at a location 232 corresponding to the value of the lifetime of the signal 211. Similarly, the signal rate change 233 has a peak at a location 234 corresponding to the value of the lifetime of the signal 214.

Various embodiments are based on a realization that the principles applying to the individual decaying signal can be extended to analyze the multi-exponential signal of the semiconductor device. Specifically, the times of the peaks of the derivative of the multi-exponential signal can serve for initial analysis of the properties of the traps in the semiconductor device.

Figure 2B:
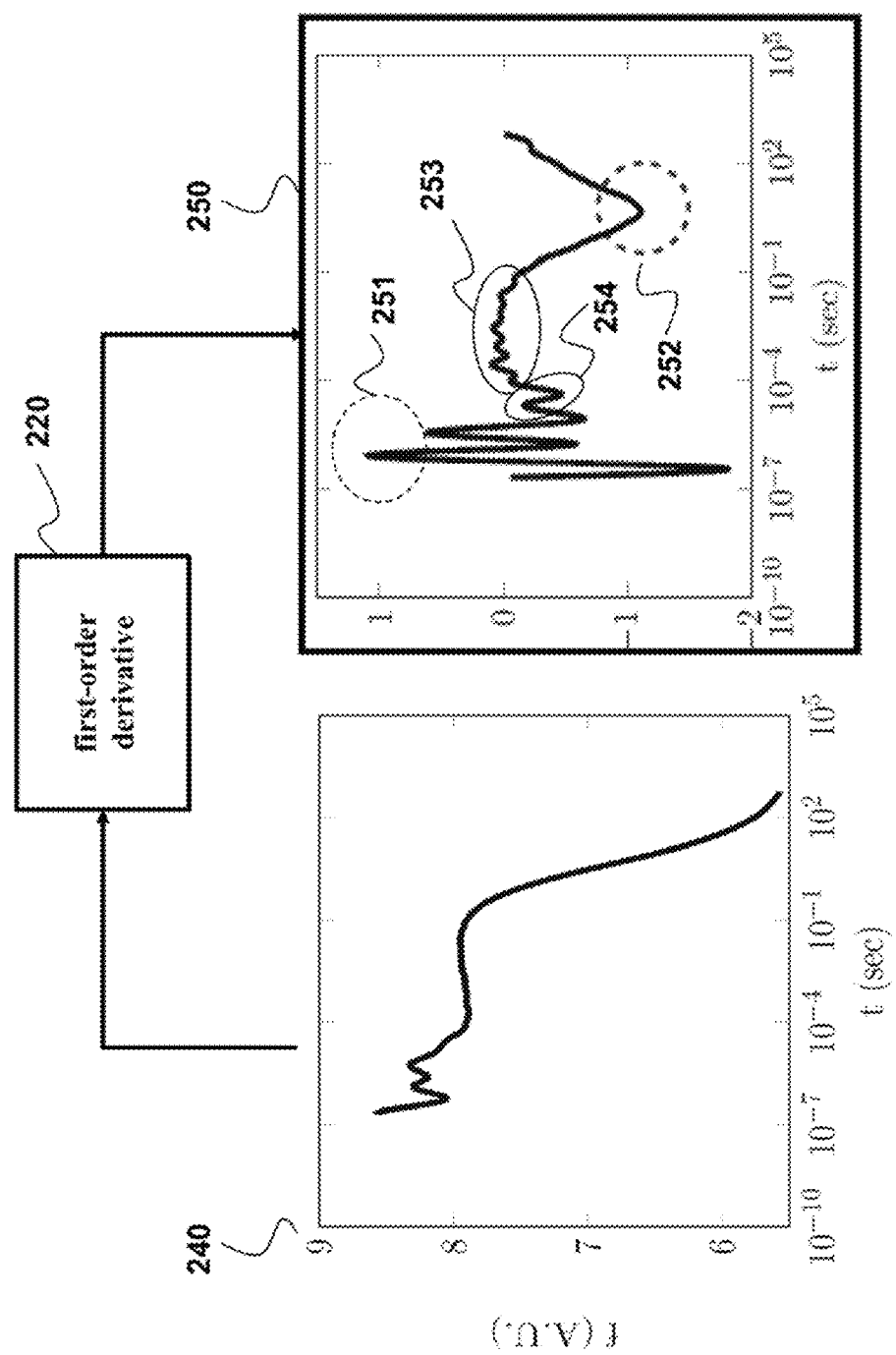

FIG. 2B illustrates this realization. The first-order derivative of the signal 250 determined 220 from the multi-exponential signal 240 includes a number of peaks, such as peaks 251 and 252. Those peaks can be used to analyze the properties of traps in the semiconductor device. For example, the locations of the peaks can be used as initial approximated values of the lifetimes in various curve fitting methods. Peaks with small, using a threshold, magnitudes 253 may be disregarded as nonessential. Nearby, using a threshold, locations of multiple peaks 254 may be combined into a single lifetime location, thus controlling how sparsely the discrete lifetimes are distributed in time.

Figure 3:
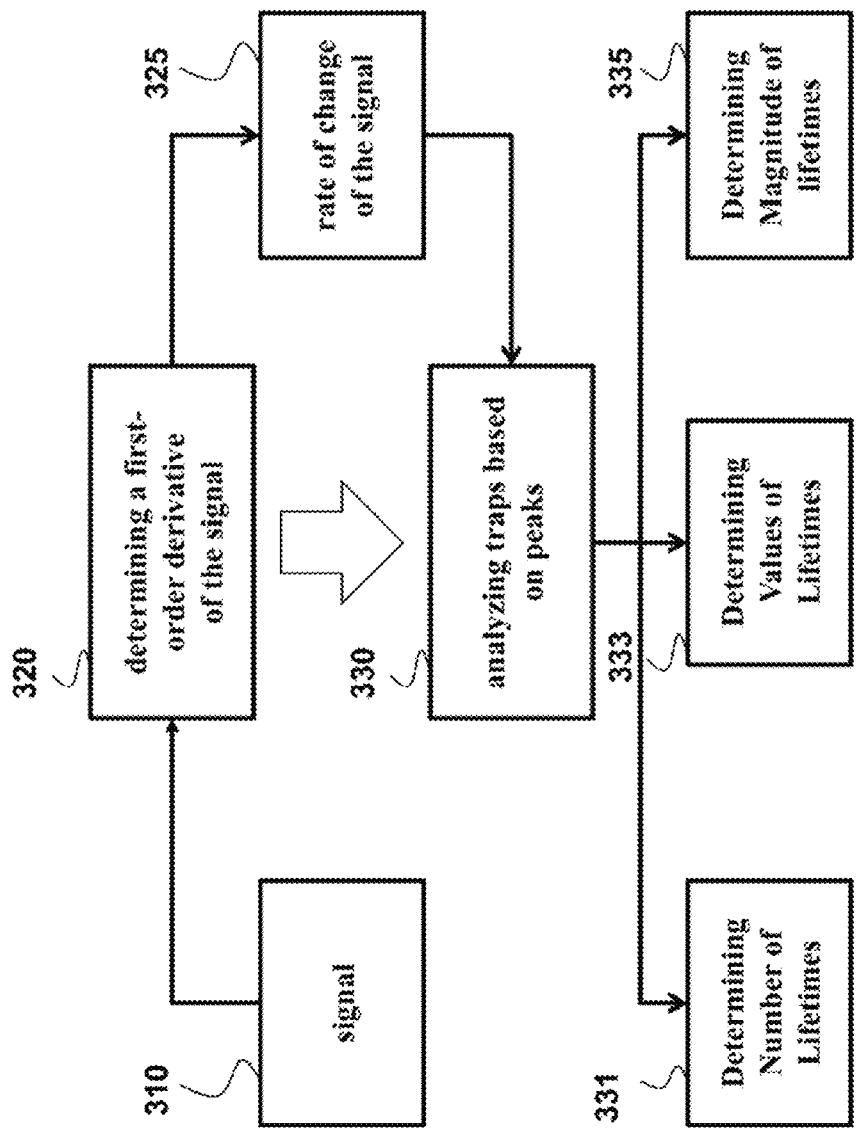
FIG. 3 is a flow diagram of a method for analyzing traps according to embodiments of the invention.

FIG. 3 shows a block diagram of a method according to some embodiments of the invention. The method includes determining 320 a first-order derivative of a signal 310 representing an operation of the semiconductor device over a period of time to produce a signal rate change 325, and analyzing 330 traps in the semiconductor device based on times corresponding to peaks of the signal rate change.

In some embodiments, the analyzing 330 can include one or a combination of determining 331 the number of the leading discrete lifetimes of the traps based on the number of the peaks, determining 333 the numerical value of each discrete lifetime based on the location of the corresponding peak, and determining 335 the magnitude (i.e., the capture or release coefficient of the trapping or detrapping process, correspondingly) for each lifetime.

The nearby locations of the dominant trap lifetimes $\tau_i$ in the time-constant spectrum are identified by finding the locations of the maxima of the absolution value of the derivative. Each maximum in the absolute value corresponds to a purely exponential component with the lifetime constant near that location to produce a good initial approximation for the values of the trap lifetimes, i.e., their total number and locations. A least squares method may then be used to determine the values of the magnitudes $c_i$ corresponding to the trap lifetimes. Using all of the above lifetimes and magnitudes as the initial approximations, a nonlinear least squares method may finally be used to optimize both $c_i$ and $\tau_i$ simultaneously.

The embodiments are based on a realization that the dominant lifetimes of the traps may be discrete, i.e., sparsely distributed. This is in sharp contrast to the prior art conventional approaches, where the dominant lifetimes of the traps are chosen to be dense and uniformly distributed. Our method is both more accurate and efficient, providing qualitative improvement, compared to the prior art conventional approaches.

Method Overview

Figure 4:
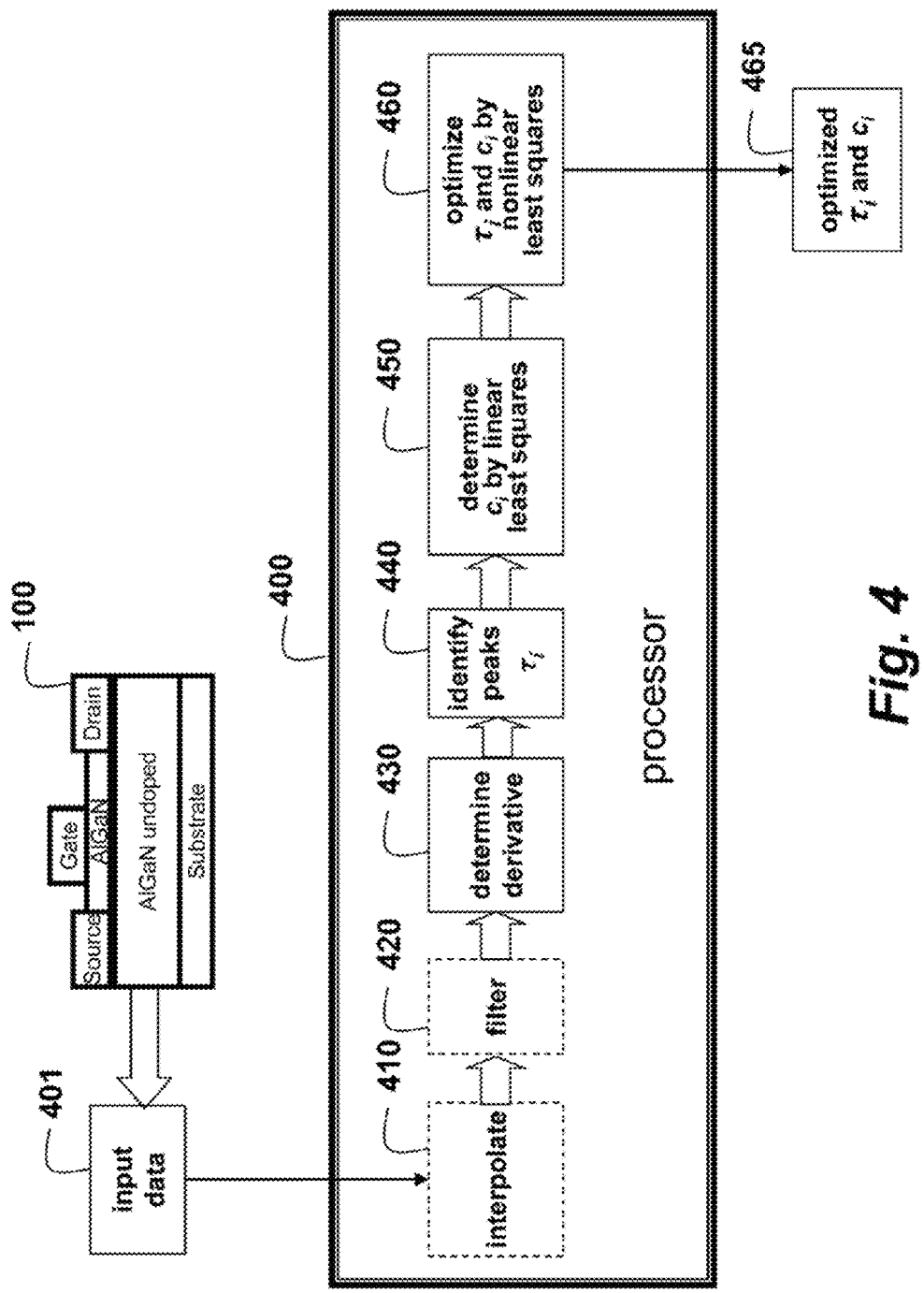
FIG. 4 is a schematic of the method for analyzing traps according to embodiments of the invention.

FIG. 4 shows a method for analyzing the semiconductor device 100, as shown in FIG. 1, by extracting discrete lifetimes $\tau$ and magnitudes c 465 of a trapping or detrapping process on processor 400 according to embodiments of our invention.

It is understood that the method can be applied to other devices and systems with a multi-exponential behavior. There are many systems where their subsystems exhibit processes that are exponential in time. By "multiexponential," we mathematically mean that the system behavior in time is described by a linear combination of a finite number of purely exponential in time functions, with different lifetimes.

Input data 401 are experimental measurements obtained from the semiconductor device by the sensor 101. The data may be measured at irregular times. While our method can be applied directly to such data, it may be beneficial to first have the data interpolated 410. One possible interpolation is a dense uniform grid in the time domain. For example, Prony's method of exponential fitting of data observations is performed equidistantly in time. Additionally or alternatively, an equidistant logarithmic time scale can be used for the interpolation, allowing accurate modeling of short-time and long-time processes using a relatively small grid size, uniform in the logarithmic time scale.

The remainder of this method overview assumes the data interpolation is performed uniformly in the logarithmic time scale. This is especially suitable for semiconductor trapping analysis, where the measurements' timing may often range from nanoseconds to several days.

One embodiment uses the grid size of $2^k$. Advantageously, the grid of such a size can filter 420 the interpolated data using the most efficient radix-2 based Fast Fourier Transform (FFT). For example, the interpolated data can be low-pass filtered using a cosine Fourier transform or smoothed to reduce noise.

The interpolating and the filtering steps are optional. Interpolating is advantageous to increase computational efficiency of the method. Filtering is advantageous for better result quality for noisy data.

In one embodiment, the cosine Fourier transform and inverse cosine Fourier transform is performed using a discrete cosine Fourier transform (DCT) and inverse discrete cosine Fourier transform (IDCT), respectively.

The unitary discrete cosine transform of x is $$y(k) = w(k) \sum_{n=1}^{N} x(n) \cos\left(\frac{\pi(2n-1)(k-1)}{2N}\right), k = 1, 2, \ldots, N,$$

where $$w(k) = \begin{cases} \frac{1}{\sqrt{N}} & k=1 \\ \sqrt{\frac{2}{N}} & 2 \le k \le N \end{cases}.$$

The inverse discrete cosine transform of y is $$x(n) = \sum_{k=1}^{N} w(k) y(k) \cos\left(\frac{\pi(2n-1)(k-1)}{2N}\right), n = 1, 2, \ldots, N.$$

The first-order derivative of the filtered data curve is determined 430. This step produces good initial values for the subsequent steps. As noted above, the interpolating and filtering can ensure that the derivatives are correct. The derivatives can be determined either by transforming the data to a frequency domain to obtain the derivative using a Fourier spectral method and then performing an inverse FFT (e.g., applying a radix-2 Cooley-Tukey algorithm) to determine the derivative in the time domain, or by a numerical method using a finite difference method, which approximates the derivative using finite difference equations.

For example, let $f_i$ be the discrete data of a function $f(x)$, which is sampled at n discrete points $x_i \in h, 2h, \ldots, ih, \ldots, 2\pi-h, 2\pi$, where $h=2\pi/n$. The FFT of this data set is taken to obtain the Fourier transform $\hat{f}_k$, i.e., $$\hat{f}_k = FFT(f_j), \text{where } k \in -n/2+1, \ldots, n/2.$$

The $v^{th}$ order of derivative of the function $f_j$ can be determined from $\hat{f}_k$ using the following identity $$FFT\left(\frac{\partial^v f_j}{\partial x^v}\right) \equiv (ik)^v \hat{f}_k,$$

where $\hat{f}_{n/2}=0$, and v is odd.

To apply the spectral method, the function $f$ should be periodic and smooth in the logarithmic time domain. To meet these requirements, the data curve in the logarithmic time domain is mirrored and then periodically extended for our FFT. By mirroring the data curve, we achieve smoothness for the function at the boundary between each period. We assume that the data include measurements for a sufficiently large time period where the behavior of the measured data has stabilized and the data function approaches a constant. The data grid size of $2^k$ is used to improve the efficiency of the FFT.

The nearby locations of the dominant trap lifetimes $\tau_i$ in the time-constant spectrum are identified 440 by finding the peaks, i.e., locations of the maxima of the absolute value of the derivative. Each maximum in the absolute value corresponds to an exponential component with the lifetime constant near that location to produce a good initial approximation for the values of trap lifetimes, i.e., their total number and time-scale locations.

A least squares method may be used to determine 450 the values of the magnitudes $c_i$ corresponding to the previously computed trap lifetimes.

Then, using all of the above lifetimes and magnitudes as the initial approximations, a nonlinear least squares method may be used to optimize 460 both $c_i$ and $\tau_i$ 465 simultaneously using a nonlinear least squares procedure. Providing such accurate initial approximations is advantageous because it typically results in a quick convergence to the global minimum. Not using any constraints in the nonlinear least squares procedure is advantageous because it allows using efficient unconstrained minimization methods, e.g., Newton's method.

Additionally or alternatively, constraints can be optionally applied during the minimization, e.g., soft constraints can be used in the form of adding penalty terms. For example, a penalty term can stabilize the minimization by encouraging the iterative values to stay close to the initial approximation. Additionally or alternatively, another example of a penalty can be stimulating the iterative lifetimes to remain discrete, i.e., sparsely distributed, and the corresponding iterative magnitudes to remain large, as determined by thresholds.

Both the data curve and its (filtered) derivative can be fitted by nonlinear least squares fitting. Fitting the derivative may give more accurate results, but is sensitive to noise. One embodiment weights differently the data curve and its derivative to put less emphasis on fitting the derivative in the presence of noise.

Data measurement for short-time scales is challenging and large measurement noise can be expected. To formulate the minimization objective function for the least squares fit, it can benefit the accuracy of the fit to put less emphasis on fitting the data at the time regions where the data measurement is expected to be less reliable.

Because the fitting function is a summation of exponential basis functions, all the information required for nonlinear least squares fitting can be calculated analytically as described below.

The basis function in log scale of time is $$f(x) = c \cdot e^{-10^{x-\tau}}$$

The Jacobian for the basis function can be calculated as $$\frac{df}{d\tau} = c \cdot e^{-10^{t-\tau}} \cdot 10^{t-\tau} \cdot \ln 10,$$

$$\frac{df}{dc} = e^{-10^{t-\tau}}.$$

The derivative of the basis function is $$g(t) = \frac{df}{dt} = -c \cdot 10^{t-\tau} \cdot e^{-10^{t-\tau}} \cdot \ln 10.$$

The Jacobian for the derivative of the basis function can be calculated as $$\frac{dg}{d\tau} = -c \cdot (\ln 10)^2 \cdot e^{-10^{t-\tau}} \cdot 10^{t-\tau} \cdot (10^{t-\tau} - 1),$$

$$\frac{dg}{d\tau} = -e^{-10^{t-\tau}} \cdot 10^{t-\tau} \cdot \ln 10.$$

Having the derivatives and the Jacobians derived as above, we can perform the nonlinear least squares fitting using a conventional Newton method, which is known to be fast and efficient. Using the analytical expression for the derivatives and the Jacobians also helps achieving greater numerical stability of the nonlinear least squares fitting, with respect to the typical presence of round-off errors.

The above method can be performed in the processor 400 connected to memory and input/output interfaces by buses as known in the art.

Figure 5:
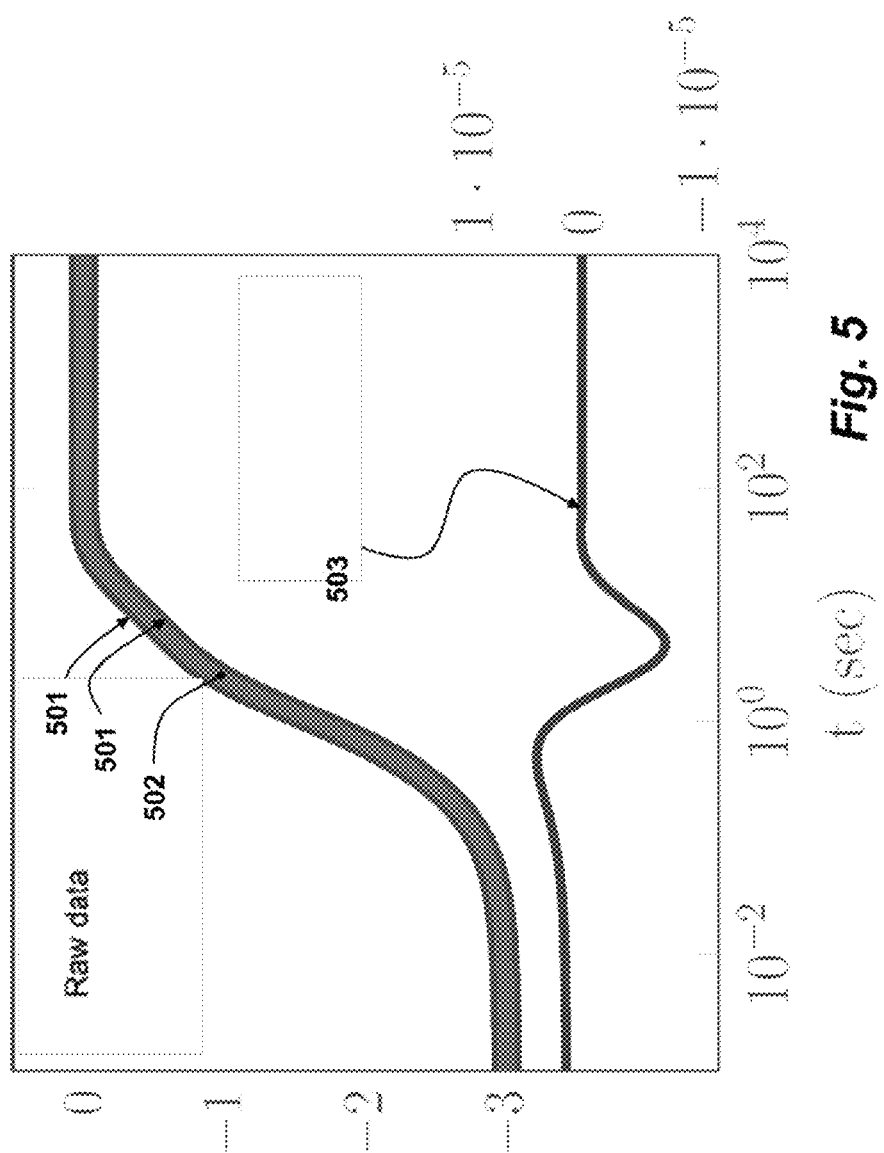
FIG. 5 is a graph of the curve of fitting and corresponding error of the fitting according to embodiments of the invention.

FIG. 5 shows the original raw data 501 for a synthetic multiexponential curve y=3−2 $e^{-t/1}-e^{-t/10}$ perturbed using an additive Gaussian noise, an extracted curve 502 fitted to the data, and an error 503 as a function of time in a logarithmic time scale. The vertical axis in terms of arbitrary units (A.U.). The units on the left are for the function and its fit; the units on the right are for the corresponding approximation error. The error between the data and the curve is bounded by $\approx 7\times 10^{-6}$. The time domain signal in this example is noisy multiexponential, additively composed of a constant 3, and two purely exponential detrapping components with lifetimes 1 and 10. The corresponding magnitudes for the lifetimes are −2 and −1.

Figure 6:
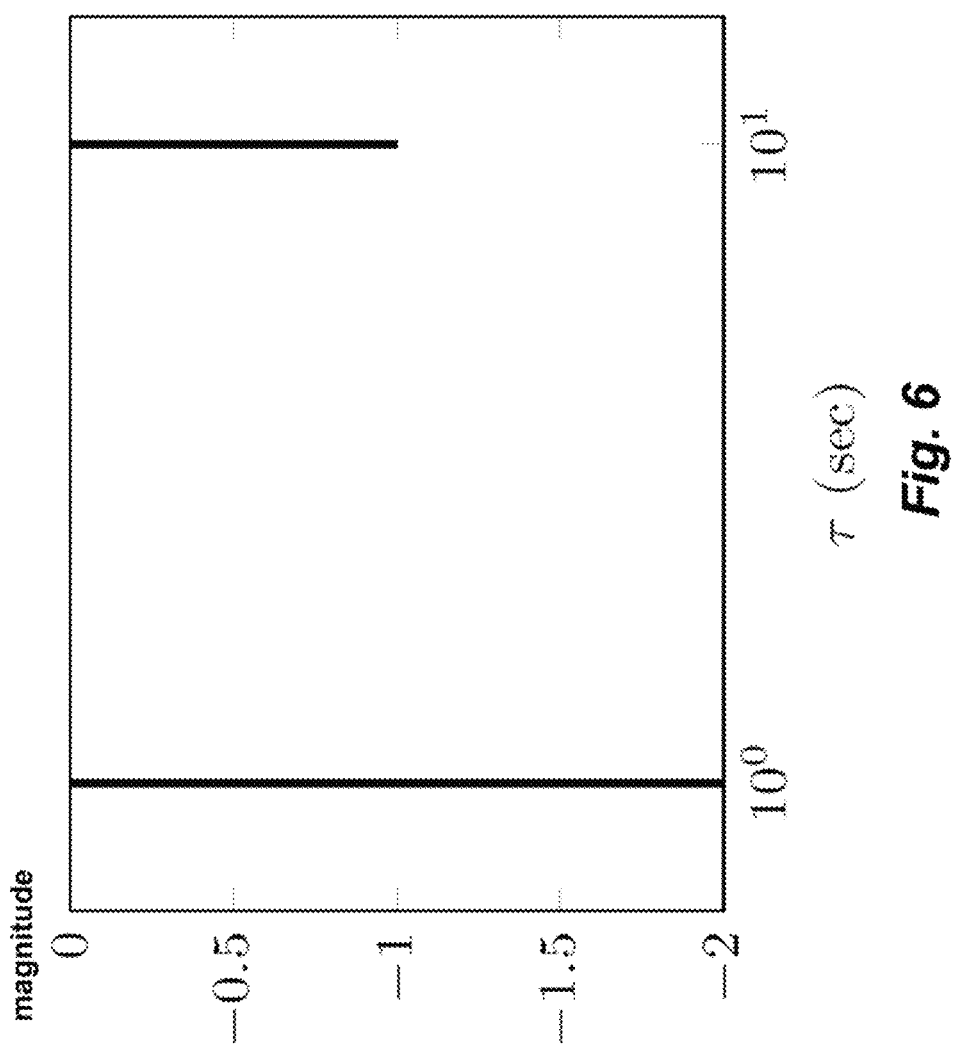
FIG. 6 is a graph of a time constant spectrum extracted from the curve of FIG. 5, and amplitudes of the corresponding magnitudes.

FIG. 6 shows the time-constant spectrum computed using our method. The time-constant spectrum accurately shows two exponential components (1 and 10) with the values of the corresponding magnitudes (−2 and −1).

The complete time-constant spectrum is extracted without errors in FIG. 6. Therefore, no extra effort is required to further process the time-constant spectrum to distinguish between true and erroneous information. The maximum error in our time constant and corresponding magnitude fitting is $\approx 6\times 10^{-6}$.

As shown in FIGS. 5 and 6 for the synthetic data function, a distribution of dominant lifetimes can be approximated as discrete, see FIG. 6, and not continuous, as essentially assumed in the prior art, numerical lifetimes. This realization provides distinct advantages for analyzing the semiconductor and enables real-time applications hitherto not possible.

Various embodiments determine the constant $I_\infty$ of the fitting function in two different ways. First, using the idea of the exponential peeling, we observe that for large times the data curve is expected to be stabilized, approaching $I_\infty$, because all lifetimes are assumed to be positive. Thus, $I_\infty$ can be set to the value of the data curve in the largest available measurement time. Typically, large-time measurements may be expected less noisy, compared to very short-time measurements, so such a choice of $I_\infty$ should not be greatly affected by measurement errors. In the rest of our analysis, the constant $I_\infty$ is then fixed and not changed in the least squares fittings. The main difficulty with this approach is that the largest time available in the data observations may not be large enough for the data curve to already stabilize in time logarithmic scale. In this case, fixing the constant $I_\infty$ as the above, introduces a systematic error, which later on in our method results in decreased efficiency and accuracy of the least squares fittings.

An alternative embodiment includes the constant $I_\infty$ as an unknown for the least squares fittings, either linear or nonlinear, or both. This inclusion increases the number of unknowns and may potentially introduce new local minima, making the nonlinear least squares minimization more difficult.

Figure 7:
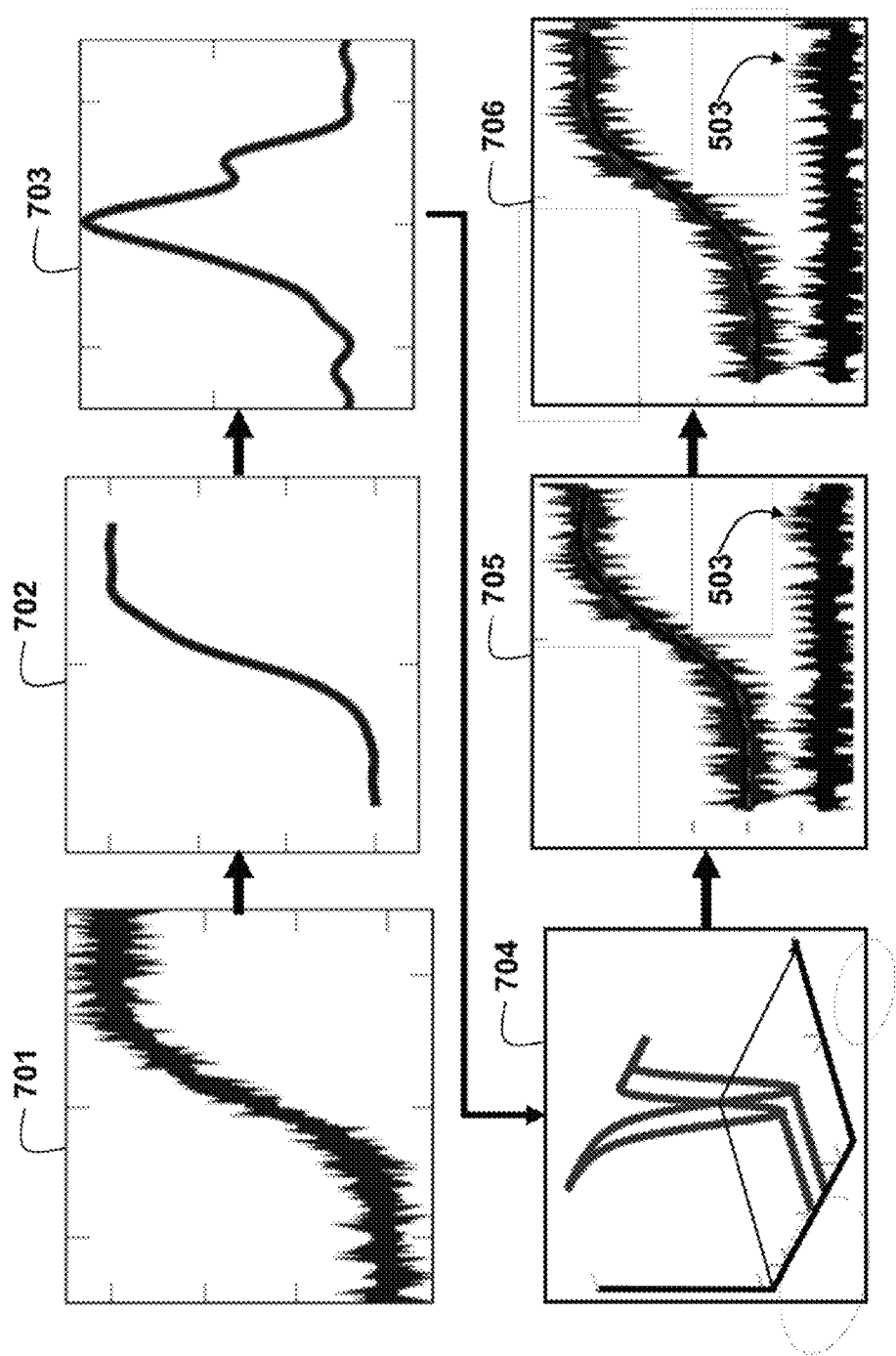
FIG. 7 are graphs depicting the data processed by the method of FIG. 4 during the various steps.

FIG. 7 shows our data, as a function $f$ of time, e.g., $\approx 10^{-3}$ to $10^3$ seconds, in a logarithmic time scale, during the processing performed by the steps of the method of FIG. 4 including the raw data 701 with random noise, the filtered data 702, first derivative of the filtered data 703, the peaks in the derivatives 704, the linear least squares fitting and the corresponding error 705, and the optimized nonlinear least square fitting and the corresponding error 706.

Figure 8A:
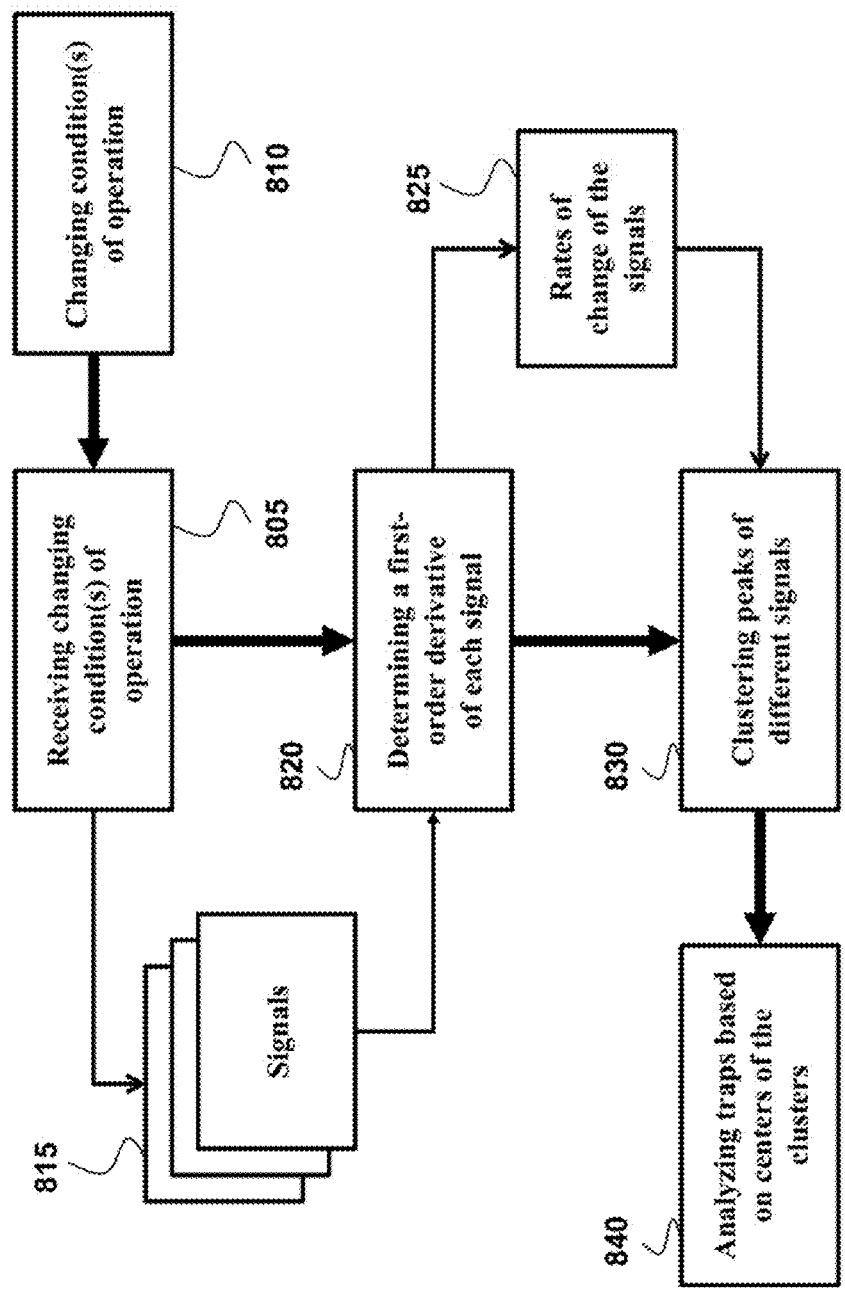
FIG. 8A is a block diagram of a matrix version of a method according to some embodiments of the invention.

FIG. 8A shows a block diagram of a matrix version of a method of some embodiments that fit multiple signals concurrently. The signals can correspond to the operations of the same semiconductor device under different conditions. For example, the traps in the multiple signals can have substantially the same lifetimes, but with different constants. Multiple data curves can be fitted independently in a multithreaded manner, using, e.g., conventional parallel computing. Alternatively, the steps can be performed on a special hardware computing processor, such as graphics processing unit (GPU) or field-programmable gate array (FPGA).

For example, the method receives 805 a set of signals 815 representing the operations of the semiconductor device under changing conditions 810. For example, the semiconductor device can be operated by changing a temperature of operation or a voltage applied to the drain of the semiconductor device. The method determines 820 a first-order derivative of each signal in the set to produce a set of signal rate changes 825. Next, the times at the location of the peaks of different signal rate changes are clustered 830 to produce a set of clusters, and the discrete lifetimes of the traps are analyzed 840 based on locations of centers of the clusters.

For example, to fit p data functions concurrently, our fitting function for each of the data function has the form $$I^j = \sum_i c_i^j e^{-t/\tau_i} + I_\infty^j, j = 1, \ldots, p,$$

where the exponential component $e^{-t/\tau_i}$ is treated as a basis function for the fitting function, the same for all p data functions. Only the magnitudes may be different.

The assumption made here is that for the chosen group of the data, the lifetimes physically are expected to be nearly the same. This assumption is expected to hold, e.g., if the group of measurements is performed on the same device within a reasonably small range of conditions, such as voltages applied to the gate, source and drain of the device, temperatures, etc. Additionally or alternatively, this assumption may hold for different devices, being manufactured and operating under similar conditions. The goal of the matrix version is to capture more reliably and accurately the lifetimes for the whole group of the measurements, while the lifetimes may be extracted wrongly or completely missing (due to the measurement noise), if each of the measurements in the group is fitted independently.

The matrix version of our method is also described by FIG. 4, as well as the single function version. Every step treats the group of the input data concurrently. Only step 440, identifying the group lifetimes, requires extra explanations for the matrix version. Step 430 determines the derivatives of all filtered data functions in the group. As for the single function version, the nearby locations of the dominant trap lifetimes in the time-constant spectrum are identified 440 by finding the locations of the maxima of the absolution value of derivative for every function. Each maximum in the absolute value corresponds to an exponential component with the lifetime constant near that location to produce a good initial approximation for the values of trap lifetimes, i.e., their total number and values, again for every function in the group.

FIG. 8B illustrates the peak identification step 440 that identifies the group lifetimes for the matrix version of the method, for three functions in the group, in this example. We have in FIG. 8B two computed lifetimes 811 and 812 for the first function, two computed lifetimes 821 and 822 for the second function, and only one computed lifetime 831 (the other one is missing, e.g., because of the noise and aggressive filtering) for the third function.

We cluster all the lifetimes, locating two clusters of lifetimes, 841 and 842. Within each cluster 841 and 842, the centers 851 and 852 of every cluster are determined, for example, by averaging the values 811, 821, and 831 for cluster 841 and values 812 and 822 for cluster 842. The values 851 and 852 are our group lifetimes, used in the linear least square fitting step 450 of the method. The calculations here are performed in the time logarithmic scale, as in all other steps of our method.

Figure 9:
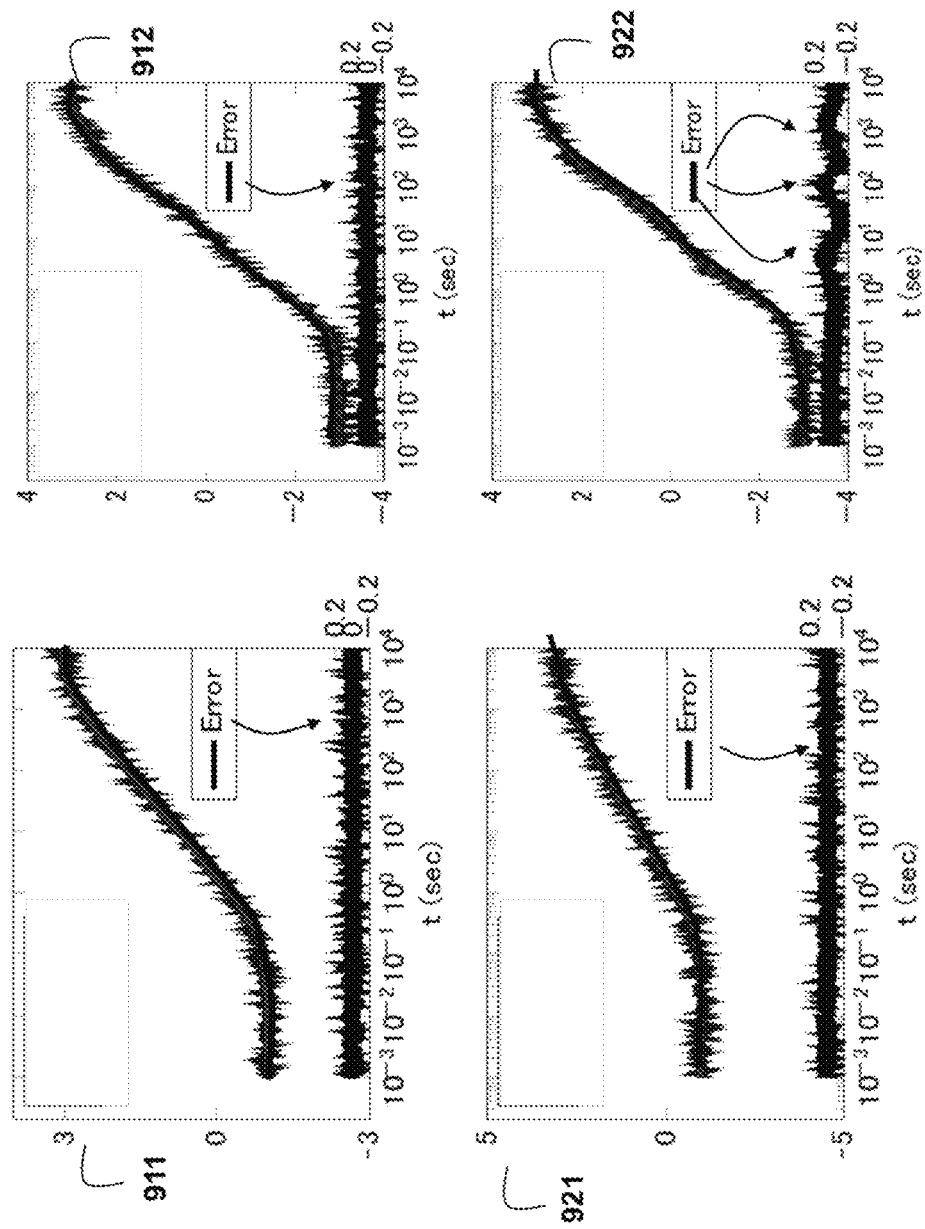
FIG. 9 are graphs for group fitting by the matrix version and individual fitting.

FIG. 9 shows the group fitting (the top row of FIGS. 911 and 912) by the matrix version of the method vs. the individual fitting (the bottom row of FIGS. 921 and 922) by the matrix version of the method, of functions $$-e^{-t/1}-e^{-t/10}-e^{-t/100}-e^{-t/1000}$$

and $$-2e^{-t/1}-e^{-t/10}-2e^{-t/100}-e^{-t/1000}$$

with added noise.

FIG. 9 shows that both functions are well approximated in 911 and 912 by the group fitting, while only function 921 is as well approximated. In contrast, the approximation error in 922 is larger and exhibits oscillations.

Figure 10:
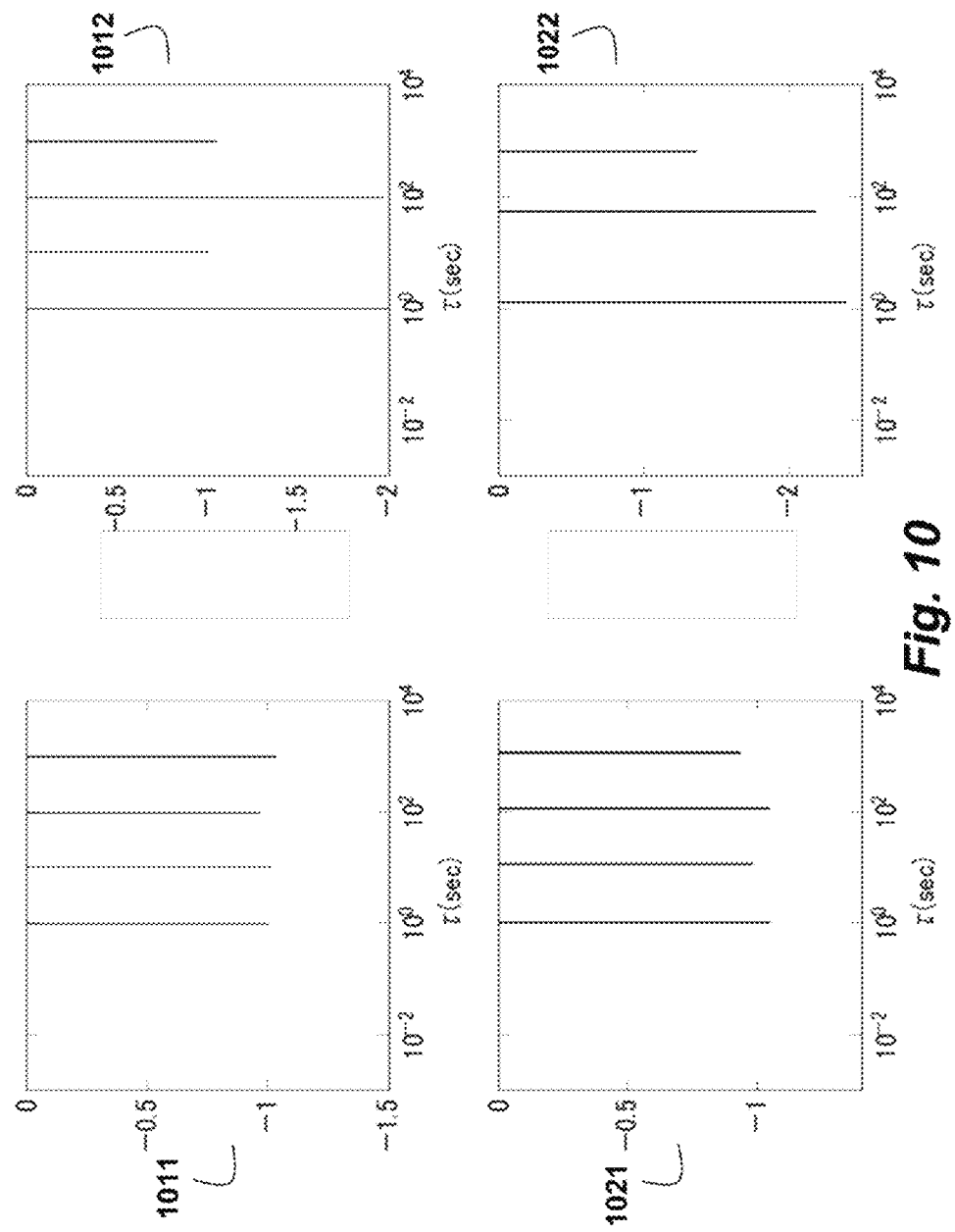
FIG. 10 are graphs of peaks corresponding to the fittings shown in FIG. 9.

FIG. 10 shows the trap lifetimes and the corresponding magnitudes for the approximations obtained as shown in FIG. 9. Specifically, the group fitting 1011 and 1012 correctly extracts the lifetimes 1, 100, 100, and 1000 and the magnitudes (−1, −1, −1, and −1 in 1011) and (−2, −1, −2, and −1 in 1012), for the corresponding functions 911 and 912. The individual fitting 1021 for the corresponding functions 921 also works reasonably well, giving correct lifetimes 1, 100, 100, and 1000 and acceptable magnitudes −1, −1, −1, and −1. However, 1022 shows that one of the lifetimes, i.e., 10, is simply missing, and magnitudes for other lifetimes significantly different from the true values, resulting in mediocre fitting 922 in FIG. 9.

Figure 11:
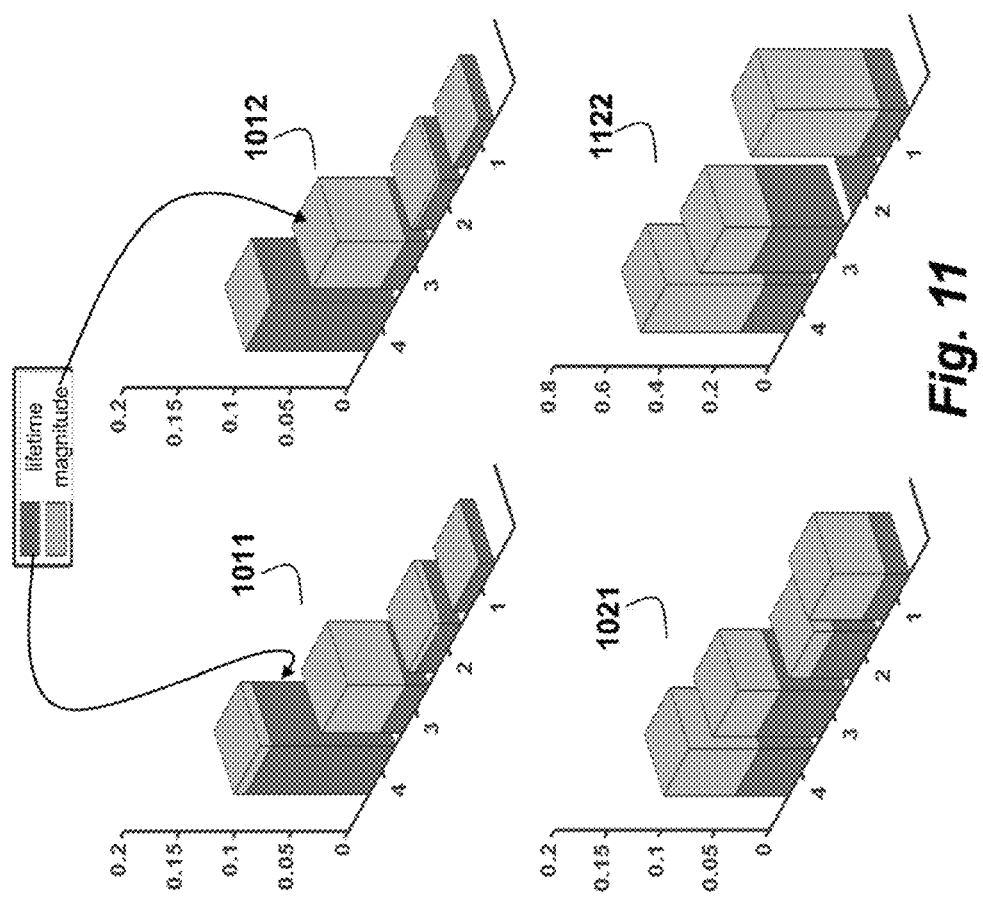
FIG. 11 are bar graphs of specific approximation errors corresponding to the fittings shown in FIG. 9.

FIG. 11 displays the specific approximation errors 1111, 1112, 1121, and 1122, for this case, corresponding to the extracted values 1011, 1012, 1021, and 1022. In FIG. 11, the magnitudes are shown in a lighter color above the lifetimes. Again as in FIG. 10, we observe in FIG. 11 the missing lifetime 10 and larger approximation errors 1022, relative to the approximations errors 1111 and 1121 for the group fitting. This supports our claim that the group fitting by the matrix version of our method captures more reliably and accurately the lifetimes for the whole group of the measurements, compared to individual fittings.

The embodiments according to our invention have the following advantages, compared to the conventional approaches, as demonstrated in the example above. The time-constant spectrum, displayed in FIG. 6, of our method clearly and accurately demonstrates all present (two in this example) lifetimes. In contrast, the conventional approaches may compute multiple erroneous lifetimes not actually present in the data.

With our method, the magnitudes corresponding to lifetimes are the actual values, whereas the prior art magnitudes only reflect a fraction among the actual values.

Our method is numerically stable and requires no constraints on the optimization, whereas the prior art uses constraints, such as lower and upper bounds or smoothness in the spectrum, to prevent ill-conditioning/over-fitting.

Our method is several orders of magnitude faster compared to the prior art, performed on similar processing devices. For example, a typical execution time of our method to fit one data curve is less than a second on a conventional processor, compared to several hours for the prior art methods, which corresponds to a decrease in processing time by about four orders of magnitude. This unexpected and remarkable improvement enables some embodiments to handle massive amounts of data in real time together with the measurements. This is important, e.g., in manufacture quality control of semiconductors, or in generating novel instantaneously adaptive and reactive instrumental tools for semiconductor testing. Prior art methods are precluded from operating in real-time environments because of excessive, and perhaps, erroneous processing, and at time requires human judgment and intervention.

For example, one embodiment can be used for manufacture quality control during test processes on the semiconductor device manufacturing line. By performing the real time trap analysis, the trap information can be extracted and indicate whether the manufactured device is reliable or not. Certain control parameters of manufacturing can then be dynamically adjusted on the extracted information to reduce the traps (defects) in the devices to improve reliability to make the manufacturing adaptive to the real-time analysis. Real time prediction can inform the operator to make adjustments so that the manufacturing line works smoothly.

Principles of various embodiments can also be used for real time failure prevention and starting a backup plan before actual failure occurs. For example, in wireless communication base station, our method can be used to extract the trap parameters of a power amplifier to detect the condition of the device. By analyzing the traps lifetime spectrum and amplitude, an early warning of an impending device failure can be made even if the device is still functioning seemingly normally. The failure prediction would warn the operator to start a backup plan to keep the communication system working smoothly.

Furthermore, it is important to monitor the operating temperatures of semiconductor devices, which can greatly affect their performance. However, using specialized temperature sensors may be difficult for individual devices due to their small size at micro- or nano-scales. Because the trap lifetimes can be very sensitive to temperature, the temperature in a specific region of an individual device can be monitored in real time by analyzing the trap lifetimes spectrum using our method. There may be also a group of traps, which is temperature independent and can be identified if the values of lifetimes do not change with temperature.

Finally, the computed trap lifetimes and magnitudes for a given semiconductor system may serve as a signature to determine the semiconductor system manufacturer. This is advantageous, e.g., to detect counterfeit semiconductor systems.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for analyzing lifetimes of traps in a semiconductor device, comprising steps:
   determining a first-order derivative of a signal representing an operation of the semiconductor device over time to produce a signal rate change over time;
   determining a number of lifetimes based on a number of peaks of the signal rate change, wherein the peaks are locally largest magnitudes of an absolute value of the of the signal rate change;
   fitting the signal representing the operation of the semiconductor device over time to a multiexponential function formed as a linear combination of exponential curves, wherein a number of the exponential curves in the linear combination equals the number of the lifetimes, and wherein each exponential curve has an exponent value and a coefficient; and
   determining one or a combination of the lifetimes in the semiconductor device and corresponding magnitudes of the lifetimes, wherein the lifetimes correspond to the exponent values of the exponential curves and the magnitudes correspond to the coefficients of the exponential curves in the linear combination, wherein the steps are performed in a processor.

2. The method of claim 1, further comprising:
   determining discrete lifetimes of the traps based on the locations of the peaks, wherein the peaks with less than a predetermined magnitude are disregarded, and wherein nearby, using a threshold, locations of multiple peaks are combined into a single lifetime to enforce the lifetimes to be discrete and sparsely distributed in time.

3. The method of claim 1, wherein the fitting of the signal representing the operation of the semiconductor device over time to the multiexponential function is determined iteratively, starting with predetermined initial values of one or a combination of the exponent values and the coefficients of the exponential curves in the linear combination.

4. The method of claim 1, further comprising:
   determining the exponent values of the exponential curves in the linear combination is performed based on locations in time of the peaks of the signal rate change; and
   determining the corresponding magnitude for each lifetime in based on fitting the signal according to the multiexponential function formed as the linear combination of exponential curves with the predetermined exponents, wherein the magnitude is given by a coefficient in the linear combination corresponding to a specific exponential curve.

5. The method of claim 4, wherein
   determining the multiexponential function by fitting the signal uses a least squares procedure.

6. The method of claim 5, further comprising:
   optimizing the approximate lifetimes and the approximate magnitudes using a nonlinear least squares procedure to determine the lifetimes and the corresponding magnitudes concurrently.

7. The method of claim 6, wherein approximate lifetimes remain discrete due to minimization constraints.

8. The method of claim 1, wherein the determining further comprises:
   determining the signal rate change using a finite difference method.

9. The method of claim 1, further comprising:
   interpolating measurements of the operation on a uniform grid having a logarithmic time scale to produce the signal; and
   filtering the signal to reduce noise.

10. The method of claim 1, wherein the determining comprises:
    determining the signal rate change using a Fourier spectral method.

11. The method of claim 1, wherein the semiconductor device is gallium nitride (GaN) high-electron-mobility transistor (HEMT).

12. The method of claim 1, wherein the lifetimes are discrete, that is, sparsely distributed in time, as determined by a threshold.

13. The method of claim 1, further comprising:
    obtaining approximate lifetimes as locations of maxima of an absolute value of a first-order derivative.

14. The method of claim 1, further comprising:
    manufacturing the semiconductor device adaptively according to the lifetimes and the corresponding magnitudes determined in real-time.

15. The method of claim 1, wherein a group of lifetimes in a matrix version of the method corresponds to centers of clusters of the lifetimes determined independently for data in the group.

16. The method of claim 1, wherein the method is performed in real time.

17. The method of claim 1, wherein multiple curves are fitted independently in a multi-threaded manner, using parallel computing.

18. The method of claim 1, wherein the steps are performed on a special hardware computing processor, a graphics processing unit (GPU) or field-programmable gate array (FPGA).

19. The method of claim 1, further comprising:
    detecting impending failures in the semiconductor device using the lifetimes.

20. The method of claim 1, wherein the lifetimes and the magnitudes correspond to manufacturing or operating conditions of the semiconductor device.

21. The method of claim 1, further comprising:
    acquiring a set of signals;
    determining the first-order derivative of each signal to produce the signal rate changes for each condition of the device;
    clustering times at the locations of the peaks of different signal rate changes to produce a set of clusters;
    determining discrete lifetimes for the set of clusters as locations of centers of each clusters, such that the number of lifetimes equals a number of the clusters;
    analyzing a corresponding magnitude for each discrete lifetime for each signal based on fitting the signal according to the multiexponential function, wherein the fitting is performed using a least squares procedure.

22. The method of claim 21, wherein the set of signals represents the operation of the semiconductor device under different conditions over time, wherein the different conditions are expected to preserve lifetimes that are the same.

23. The method of claim 21, wherein the set of signals represents the operation of different semiconductor devices being manufactured and operating under similar conditions over time, wherein the similar conditions are expected to preserve lifetimes that are the same.

24. An apparatus, comprising:
    a semiconductor device;
    a sensor for measuring a signal representing an operation of the semiconductor device over time; and
    a processor configured for
    determining a first-order derivative of a signal representing an operation of the semiconductor device over time to produce a signal rate change over time;

determining a number of lifetimes based on a number of peaks of the signal rate change, wherein the peaks are locally largest magnitudes of an absolute value of the of the signal rate change;

fitting the signal representing the operation of the semiconductor device over time to a multiexponential function formed as a linear combination of exponential curves, wherein a number of the exponential curves in the linear combination equals the number of the lifetimes, and wherein each exponential curve has an exponent value and a coefficient; and determining one or a combination of the lifetimes in the semiconductor device and corresponding magnitudes of the lifetimes, wherein the lifetimes correspond to the exponent values of the exponential curves and the magnitudes correspond to the coefficients of the exponential curves in the linear combination.

25. The apparatus of claim 24, wherein the analyzing is performed in order to provide manufacture quality control.

26. The apparatus of claim 24, wherein the analyzing is performed to predict failures in the device.

27. The apparatus of claim 24, wherein the analyzing is performed to detect a change in an operating temperature.

28. The apparatus of claim 24, wherein the lifetimes of the traps and magnitudes of the traps serve as a signature to determine semiconductor system manufacturer.

29. The apparatus of claim 24, wherein the analyzing is performed in real time.

30. A non-transitory computer readable storage medium embodied thereon a program executable by a processor for performing a method, the method comprising:

determining a first-order derivative of a signal representing an operation of the semiconductor device over time to produce a signal rate change over time;

determining a number of lifetimes based on a number of peaks of the signal rate change, wherein the peaks are locally largest magnitudes of an absolute value of the of the signal rate change;

fitting the signal representing the operation of the semiconductor device over time to a multiexponential function formed as a linear combination of exponential curves, wherein a number of the exponential curves in the linear combination equals the number of the lifetimes, and wherein each exponential curve has an exponent value and a coefficient; and determining one or a combination of the lifetimes in the semiconductor device and corresponding magnitudes of the lifetimes, wherein the lifetimes correspond to the exponent values of the exponential curves and the magnitudes correspond to the coefficients of the exponential curves in the linear combination.

31. A method for analyzing lifetimes of traps in a semiconductor device, comprising steps:

acquiring a set of signals representing an operation of the semiconductor device over time;

determining the first-order derivative in time of each signal over time to produce signal rate changes over time for each condition of the device;

determining peaks of the signal rate changes, wherein the peaks are locally largest magnitudes of an absolute value of the of the signal rate change;

clustering in time of the peaks of different signal rate changes for the set of the signals to produce a set of peak clusters;

determining a number of lifetimes based on a number of the peak clusters;

fitting the set of the signals representing the operation of the semiconductor device over time to a set of multiexponential functions, wherein each multiexponential functions is formed as a linear combination of exponential curves, wherein a number of the exponential curves in the linear combination equals the number of the lifetimes, and wherein each exponential curve has an exponent value, the same for the whole set of the multiexponential functions, and a coefficient; and determine one or a combination of lifetimes in the semiconductor device using the exponent values of the exponential curves and of a set of corresponding magnitudes equal to the set of the coefficients of the exponential curves in the linear combinations, wherein the steps are performed in a processor.

* * * * *